United States Patent [19]
Yamashita

[11] Patent Number: 6,104,120
[45] Date of Patent: Aug. 15, 2000

[54] ELECTRIC CHARGE TYPE SENSOR

[75] Inventor: Muneharu Yamashita, Toyama-ken, Japan

[73] Assignee: Murata Manufacturing Co., Ltd., Japan

[21] Appl. No.: 09/250,801

[22] Filed: Feb. 17, 1999

[30] Foreign Application Priority Data

Feb. 25, 1998 [JP] Japan .................................. 10-062096

[51] Int. Cl.⁷ .................................................. H01L 41/08
[52] U.S. Cl. ........................................................ 310/319
[58] Field of Search .................................... 310/316, 317, 310/319, 338, 339

[56] References Cited

U.S. PATENT DOCUMENTS

| | | | |
|---|---|---|---|
| 3,612,966 | 10/1971 | Dybel .................................. | 310/319 X |
| 4,178,525 | 12/1979 | Barr et al. ............................ | 310/319 |
| 4,545,041 | 10/1985 | Tims et al. .......................... | 310/319 X |
| 5,034,648 | 7/1991 | Gastgeb ............................... | 310/319 X |
| 5,130,598 | 7/1992 | Verheyen et al. .................... | 310/316 |
| 5,347,870 | 9/1994 | Dosch et al. ........................ | 310/319 X |

FOREIGN PATENT DOCUMENTS 8338781  12/1996  Japan .

*Primary Examiner*—Mark O. Budd
*Attorney, Agent, or Firm*—Ostrolenk, Faber, Gerb & Soffen, LLP

[57] ABSTRACT

An electric charge type sensor includes a detection element detecting a physical property to be detected and outputting a detection signal in the form of electric charge and an operational amplifier having an output terminal, an inversion input terminal and a non-inversion input terminal. The inversion input terminal is connected to the detection element while the non-inversion input terminal is connected to a reference potential. The electric charge type sensor further comprises a feedback capacitor, a voltage divider and a feedback resistor. The feedback capacitor is connected between the output terminal and the inversion input terminal. The voltage divider is connected to the output terminal for providing a partial voltage of an output voltage at the output terminal. A feedback resistor is connected between the voltage divider and the inversion input terminal.

5 Claims, 2 Drawing Sheets

ELECTRIC CHARGE TYPE SENSOR

BACKGROUND OF THE INVENTION

1. Field of the Invention

The present invention relates to an electric charge type sensor, such as a piezoelectric type acceleration sensor and a pyroelectric type infrared sensor.

2. Description of the Related Art

Piezoelectric type acceleration sensors, pyroelectric type infrared sensors or the like are known as sensors which output a detection signal in the form of an electric charge. In these sensors, if a detection element which consists of a piezoelectric element, a pyroelectric element, or the like detects an acceleration, an infrared ray, etc., an electric charge will be generated on the surface of the detection element. Since this electric charge amount is so small (for example, 0.01 to several hundreds pico-coulombs), it is necessary to amplify this charge and output it as a voltage signal etc. For example, Japanese Laid-Open Patent Publication No. 8-338781 discloses that the output of a detection element is amplified with a charge amplifier.

FIG. 1 shows a circuit diagram used in a conventional acceleration sensor having a charge amplifier. In this acceleration sensor, a feedback capacitor 14 and a feedback resistor 13 are connected in parallel between an output terminal and an inversion input terminal of an operational amplifier 11. A non-inversion input terminal of the operational amplifier 11 is applied with a reference voltage $V_{ref}$. An output terminal of a piezoelectric element 2 which is a detection element for detecting an acceleration is connected to the inversion input terminal of the operational amplifier 11, and the other terminal of the piezoelectric element 12 is applied with the reference voltage $V_{ref}$.

In the acceleration sensor having such a construction, the piezoelectric element 12 is structured such that, when an acceleration or a vibration is applied to the piezoelectric element 12, a charge in accordance with the degree of the acceleration or vibration is generated at the output terminal. The operational amplifier 11 outputs a voltage $V_0$ in accordance with an amount of the charge Q generated at the output terminal of the piezoelectric element 12. The voltage $V_0$ is expressed by the following equation:

$$V_{o(s)} = -sQ \cdot \frac{R_f}{1 + sC_f R_f} \quad (1)$$

where $C_f$ is a capacitance of the feedback capacitor 14, and $R_f$ is a resistance of the feedback resistor 13. $V_{o(s)}$ represents a Laplace transform function denoted as a algebraic equation with respect to s.

FIG. 2 shows a frequency characteristics of the acceleration sensor defined by the equation (1). The frequency characteristic such as that shown in FIG. 2 is characterized by the output voltage in the flat region and a cut-off frequency $f_c$. The cut-off frequency $f_c$ is defined by the frequency f where the output voltage is reduced by 3 dB from the output voltage $|V_0|(|Q/C_f|)$ in the flat region. In the case where the acceleration sensor has the circuit as shown in FIG. 1, the cut-off frequency $f_c$ is expressed by the following equation (2).

$$f_c = \frac{1}{2\pi C_f R_f} \quad (2)$$

In the acceleration sensor, it is preferable that the cut-off frequency is made small in order to broaden the sensitive region of the acceleration or vibration by enlarging the flat region of the frequency characteristics.

As shown in the equation (2), it is necessary to increase the capacitance $C_f$ of the feedback capacitor 14 or the resistance $R_f$ of the feedback resistor 13 in order to lower the cut-off frequency. However, if the capacitance $C_f$ is increased, there arises a problem that the acceleration sensor becomes unstable in operation and is likely to cause an oscillation. Further, the output voltage $V_0$ of the flat region becomes so small that the sensitivity degrades. On the other hand, in the case where the resistance $R_f$ is increased, the resistance $R_f$ must be greater than 100 MΩ. Since the resistor having such a high resistance is expensive, there arises a problem that the acceleration sensor becomes expensive.

For the forgoing reasons, there is a need for an electric charge type sensor which has a small cut-off frequency without using a feedback resistor having a high resistance, which outputs a large output voltage and which operates stably.

SUMMARY OF THE INVENTION

The present invention is directed to an electric charge type sensor that satisfies this need. The electric charge type sensor comprises: a detection element detecting a physical property to be detected and output a detection signal in the form of electric charge; an operational amplifier having an output terminal, an inversion input terminal and a non-inversion input terminal. The inversion input terminal is connected to the detection element while the non-inversion input terminal is connected to a reference potential. The electric charge type sensor further comprises a feedback capacitor, a voltage divider and a feedback resistor. The feedback capacitor is connected between the output terminal and the inversion input terminal. The voltage divider is connected to the output terminal, for providing a partial voltage of an output voltage at the output terminal. A feedback resistor is connected between the voltage divider and the inversion input terminal.

According to the present invention, a cut-off frequency can be reduced, without changing the output voltage in a flat region by changing the partial voltage by a voltage divider. Therefore, a cut-off frequency can be reduced by the voltage divider. Accordingly, the sensitivity range can be made large, without making a circuit unstable or using the resistance of expensive high resistance value.

For the purpose of illustrating the invention, there is shown in the drawings several forms which are presently preferred, it being understood, however, that the invention is not limited to the precise arrangements and instrumentalities shown.

DETAILED DESCRIPTION OF A PREFERRED EMBODIMENT

Hereinafter, the preferred embodiment of the present invention is explained in detail with reference to the drawings.

Figure 1:
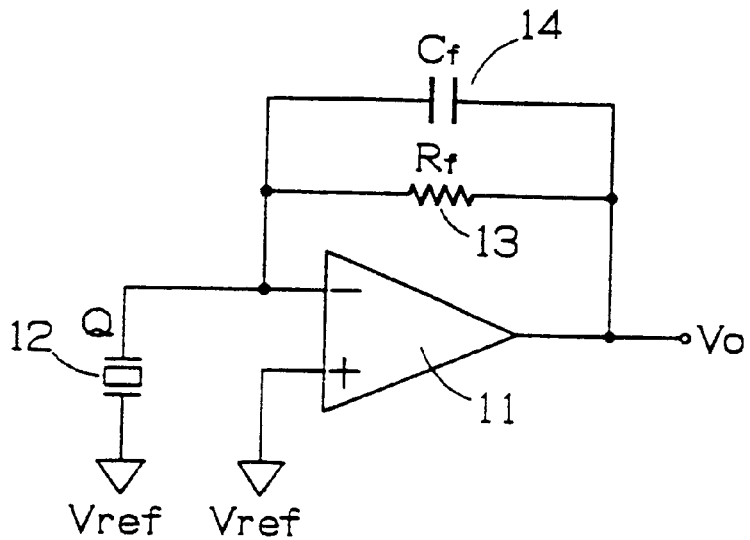
FIG. 1 is a circuit diagram showing a conventional acceleration sensor.
Figure 2:
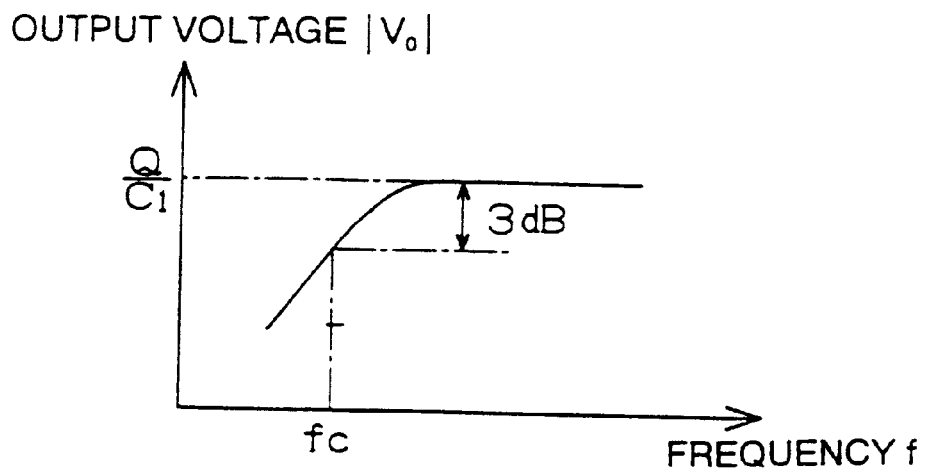
FIG. 2 is a graph showing the frequency characteristic of an acceleration sensor shown in FIG. 1.
Figure 3:
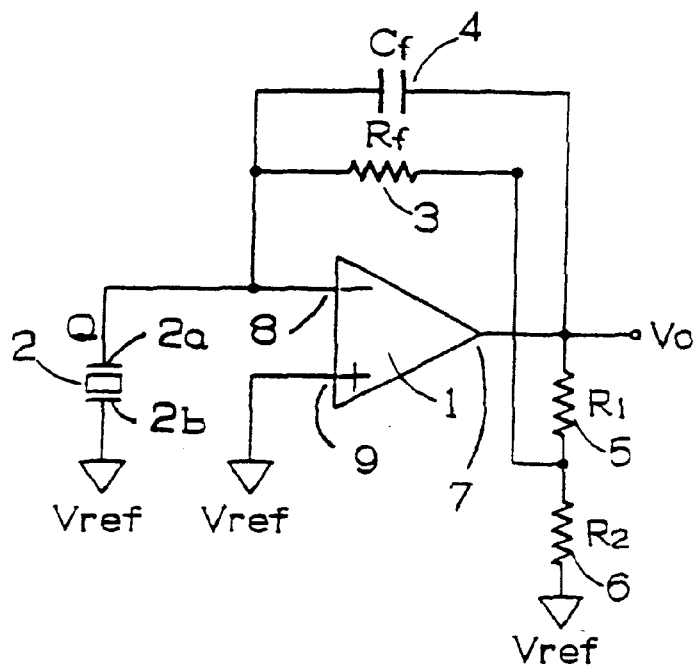
FIG. 3 is a circuit diagram showing a charge detection type sensor according to one embodiment of this invention.

FIG. 3 is a circuit diagram showing an electric charge type sensor according to an embodiment of the present invention.

The electric charge type sensor shown in FIG. 3 comprises a detection element 2 and an operational amplifier 1. The detection element 2 detects a physical property to be detected and outputs a detection signal in the form of electric charge. The detection element 2 may be any of various types of elements as long as the element outputs a detection signal in the form of electric charge. For example, the detection element 2 may be a piezoelectric element which detects an acceleration or a vibration. The detection element 2 may also be a pyroelectric infrared element detecting infrared rays.

The operational amplifier 1 has an output terminal 7, an inversion input terminal 8 and a non-inversion input terminal 9. The inversion input terminal 8 is connected to a terminal 2a of the detection element 2. The non-inversion input terminal 9 and the other terminal 2b of the detection element 2 are respectively connected to a reference voltage Vref which is generated at a reference voltage generation circuit (not shown).

A feedback capacitor 4 having a value $C_f$ is connected between the inversion input terminal 8 and the output terminal 7. A series connection of a resistor 5 and a resistor 6 is connected between the output terminal and the reference voltage Vref. The series connection of a resistor 5 and a resistor 6 acts as a voltage divider to provide a partial voltage of the output voltage of the output terminal at the connection point of the resistor 5 and the resistor 6. A feedback resistor 3 having a value $R_f$ is connected between the inversion input terminal 8 and the connection point of the resistor 5 and the resistor 6.

When an acceleration or a vibration is applied to the detection element 2, a charge Q in accordance with the degree of the acceleration or vibration is generated at the output terminal 2a of the detection element 2. The operational amplifier 1 receives the charge Q from the detection element 2 as a detection signal and outputs a voltage $V_0$ in accordance with an amount of the charge Q. The voltage $V_0$ is expressed by the following equation:

$$fV_{o(s)} = -sQ \cdot \frac{\frac{R_f R_1 + R_f R_2 + R_1 R_2}{R_2}}{1 + sC_f \left( \frac{R_f R_1 + R_f R_2 + R_1 R_2}{R_2} \right)} \quad (3)$$

where $C_f$ is a capacitance of the feedback capacitor 4, $R_f$ is a resistance of the feedback resistor 3, $R_1$ and $R_2$ are resistances of the resistors 5 and 6, respectively. $V_{o(s)}$ represents a Laplace transform function denoted as a algebraic equation with respect to s.

Figure 4:
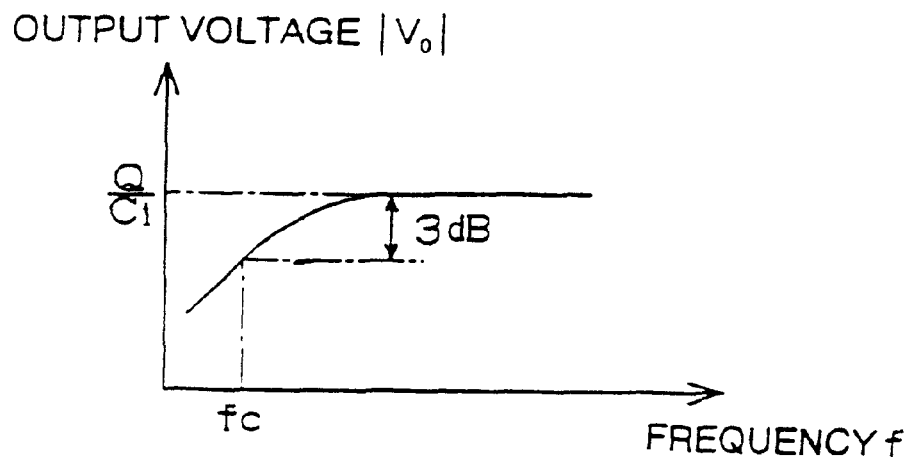
FIG. 4 is a graph showing the frequency characteristic of a charge detection type sensor shown in FIG. 3.

FIG. 4 shows a frequency characteristics of the acceleration sensor defined by the equation (3). It should be noted that the output voltage in the flat region is $|V_0|$ ($|Q/C_f|$) which is the same as that obtained in the conventional electric charge type sensor. The cut-off frequency $f_c$ is expressed by the following equation (4).

$$f_c = \frac{1}{2\pi C_f \left( \frac{R_f R_1 + R_f R_2 + R_1 R_2}{R_2} \right)} = \frac{1}{2\pi C_f R_f \left( 1 + \frac{R_1}{R_2} + \frac{R_1}{R_2} \right)} \quad (4)$$

As is understood from the equations (3) and (4), the cut-off frequency can be reduced to $1/(1+R_1/R_2+R_1/R_f)$, compared to the conventional sensor while the output voltage in the flat region can be maintained at $|V_0|$ ($|Q/C_f|$). Accordingly, it is possible to broaden the sensitivity region by enlarging the flat region without degrading the sensitivity.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electric charge type sensor comprising:

a detection element to detect a physical property to be detected and to output a detection signal in the form of electric charge;

an operational amplifier having an output terminal, an inversion input terminal and a non-inversion input terminal, the inversion input terminal being connected to the detection element, the non-inversion input terminal being connected to a reference potential terminal;

a feedback capacitor connected between the output terminal and the inversion input terminal;

a voltage divider connected to the output terminal for providing a partial voltage of an output voltage at the output terminal; and a feedback resistor connected between the voltage divider and the inversion input terminal.

2. An electric charge type sensor according to claim 1, wherein the voltage divider comprises a first resistor and a second resistor connected in series between the output terminal and the reference potential terminal.

3. An electric charge type sensor according to claim 2, wherein the feedback resistor is connected to a connection point of the first resistor and the second resistor.

4. An electric charge type sensor according to claim 3, wherein the detection element is a piezoelectric element for detecting an acceleration.

5. An electric charge type sensor according to claim 3, wherein the detection element is a pyroelectric element for detecting an infrared ray.

* * * * *